United States Patent
Yoo et al.

[11] Patent Number: 5,858,830
[45] Date of Patent: Jan. 12, 1999

[54] METHOD OF MAKING DUAL ISOLATION REGIONS FOR LOGIC AND EMBEDDED MEMORY DEVICES

[75] Inventors: Chue-San Yoo; Mong-Song Liang, both of Hsin-chu, Taiwan

[73] Assignee: Taiwan Semiconductor Manufacturing Company, Ltd., Hsin-Chu, Taiwan

[21] Appl. No.: 873,835

[22] Filed: Jun. 12, 1997

[51] Int. Cl.$^6$ .................. H01L 21/8242; H01L 21/336; H01L 21/76

[52] U.S. Cl. .................. 438/241; 438/258; 438/425; 438/296; 438/297

[58] Field of Search .................. 438/239, 258, 438/425, 424, 426, 296, 297, 241

[56] References Cited

U.S. PATENT DOCUMENTS

| | | |
|---|---|---|
| 4,352,236 | 10/1982 | McCollum . |
| 4,980,311 | 12/1990 | Namose . |
| 4,981,812 | 1/1991 | Nishizaka . |
| 5,061,654 | 10/1991 | Shimizu et al. . |
| 5,112,772 | 5/1992 | Wilson et al. . |
| 5,173,436 | 12/1992 | Gill et al. . |
| 5,455,438 | 10/1995 | Hashimoto et al. .............. 257/391 |
| 5,466,623 | 11/1995 | Shimizu et al. . |
| 5,506,160 | 4/1996 | Chang . |
| 5,677,232 | 10/1997 | Kim et al. . |
| 5,683,921 | 11/1997 | Nishio et al. . |
| 5,712,205 | 1/1998 | Park et al. ..................... 438/425 |
| 5,728,620 | 3/1998 | Park ............................. 438/425 |
| 5,731,221 | 3/1998 | Kwon . |

Primary Examiner—Richard A. Booth
Attorney, Agent, or Firm—George O. Saile; Stephen B. Ackerman

[57] ABSTRACT

A method for forming thick field oxide regions, to be used for isolation in MOSFET memory regions, while also forming insulator filled, narrow trenches, to be used for isolation purposes in MOSFET logic regions, has been developed. The fabrication process features initially creating thick field oxide regions, in the MOSFET memory region, obtained via thermal oxidation procedures, followed by creation of a narrow trench opening, in the MOSFET logic region. An ozone aided, silicon oxide, CVD deposition, is used to fill the narrow trench openings, followed by a selective chemical mechanical polishing procedure, used to remove unwanted regions of silicon oxide layer, creating an insulator filled, narrow trench isolation, in the MOSFET logic region.

8 Claims, 4 Drawing Sheets

US 5,858,830

METHOD OF MAKING DUAL ISOLATION REGIONS FOR LOGIC AND EMBEDDED MEMORY DEVICES

BACKGROUND OF THE INVENTION

1. Field of the Invention

This invention relates to fabrication processes used to create specific isolation regions needed to optimize the performance of both logic and memory devices, fabricated on a single semiconductor chip.

2. Description of Prior Art

Advanced semiconductor chips, now being manufactured in industry, are composed of logic or memory devices. Logic devices are used to process information or data, while memory devices are used for data storage. These two types of devices can be found in almost all computers, however they are usually found on specific chips, reserved for either logic or memory applications. In systems in which logic and memory devices are packaged separately, data signals between the two may have to pass through several levels of packaging, which can result in undesirable propagation delays. In addition the manufacturing costs for fabricating wafers producing only logic chips, and wafers with only memory chips, are greater than if both logic and memory applications can be incorporated on the same chip. Therefore for performance and cost reasons the semiconductor industry has been motivated to produce a semiconductor chip with both the desired logic and memory requirements.

The efforts displayed by the semiconductor industry, in attempting to incorporate both logic and memory requirements on a single semiconductor chip have been increasing. Examples of this have been Takemoto, in U.S. Pat. No. 5,066,602, as well as by Vora, in U.S. Pat. No. 5,340,762. These inventions have addressed incorporating bipolar devices and complimentary metal oxide semiconductor, (CMOS), devices, on a single semiconductor chip. However neither of these inventions address the isolation regions, used to physically, and electrically, separate specific components of these devices from each other. Traditionally memory devices have been fabricated using LOCOS, or thermally grown field oxide, (FOX), regions, for isolation purposes. This type of isolation offers acceptable junction leakage needed for memory type devices. However for peripheral logic circuits, trench isolation offers greater protection against latch-up phenomena, then LOCOS counterparts. In addition logic device performance would be enhanced with the reduction in area consumed by trench isolation regions. Therefore a process has been invented which integrates both LOCOS and trench isolation regions, into the fabrication procedure used for forming both embedded memory devices, and peripheral logic devices, on a single semiconductor chip.

SUMMARY OF THE INVENTION

It is an object of this invention to provide a process for fabricating metal oxide semiconductor field effect transistor, (MOSFET), memory and MOSFET logic devices on the same semiconductor chip, or integrated circuit.

It is another object of this invention to use a LOCOS isolation region for embedded memory devices, while using a trench isolation process for the peripheral logic devices, both created on a single semiconductor chip.

In accordance with the present invention a fabrication process is described for forming LOCOS isolation regions for MOSFET memory devices, and forming insulator filled, narrow trench isolation regions, for MOSFET logic devices, on the same silicon chip. A pad oxide layer and an overlying silicon nitride layer are grown on semiconductor substrate. Patterning, comprised of photolithographic and reactive ion etching, (RIE), is performed to create an opening in the silicon nitride - pad oxide layers, exposing a section of the semiconductor substrate to be used for MOSFET memory devices. A thick field oxide region is then thermally grown, resulting in a FOX isolation region, in the MOSFET memory sector. Patterning, again comprised of photolithographic and RIE procedures, is next used to open a region in the silicon nitride - pad oxide layers, with the RIE procedure continuing to form a narrow trench region in the semiconductor substrate, in an area of the semiconductor substrate to be used for MOSFET logic devices. A thin thermal oxide is grown on the exposed surfaces of the narrow trench, followed by a deposition of a thick, chemically vapor deposited, (CVD), insulator layer, using ozone as a source, completely filling the narrow trench. A chemical mechanical polishing, (CMP), procedure is next used to selectively remove the thick insulator layer from the top surface of the silicon nitride layer, resulting in an insulator filled, narrow trench, in the area of the semiconductor substrate to be used for MOSFET logic devices. The CMP procedure, when removing the thick insulator layer from the surface of the silicon nitride layer in the MOSFET memory sector, also removes a top portion of the FOX isolation region. The silicon nitride and pad oxide layers are next removed resulting in an area of the semiconductor substrate, exhibiting insulator filled, narrow trenches, to be used for isolation for MOSFET logic devices, and another area of the semiconductor substrate, exhibiting thick FOX regions, to be used for MOSFET memory devices.

BRIEF DESCRIPTION OF THE DRAWINGS

The object and other advantages of this invention are best described in the preferred embodiment with reference to the attached drawings that include.

DESCRIPTION OF THE PREFERRED EMBODIMENTS

Figure 1:
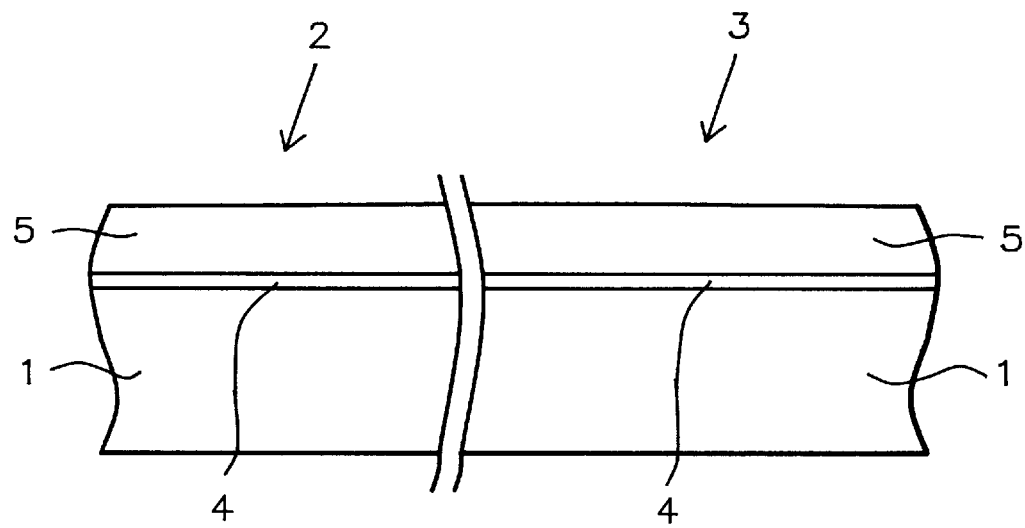
FIGS. 1–7, which schematically, in cross-sectional style, illustrate the stages of fabrication used to form thick FOX isolation regions, in an area of the semiconductor substrate used for MOSFET memory devices, and the fabrication stages used to create insulator filled, narrow trenches, used for isolation of MOSFET logic devices, in another area of the semiconductor substrate.

The fabrication process used to create thick, FOX isolation regions for MOSFET memory devices, and to create insulator filled, narrow trenches for isolation of MOSFET logic devices, both on a single semiconductor chip will now be covered in detail. FIG. 1, shows an region 2, of semiconductor substrate 1, to be used for fabrication of the MOSFET logic devices, with the insulator filled, narrow trenches used for isolation, while region 3, of semiconductor substrate 1, will be used for MOSFET memory devices, using thick field oxide regions for isolation.

A P type, single crystalline silicon substrate, 1, having a <100> crystallographic orientation is used. A pad oxide layer, 4, comprised of silicon oxide, is thermally grown in an oxygen ambient, at a temperature between about 850° to 1050° C., to a thickness between about 100 to 125 Angstroms. Next a silicon nitride layer 5, is deposited using either low pressure chemical vapor deposition, (LPCVD), or plasma enhanced chemical vapor deposition, (PECVD), procedures, at a temperature between about 300° to 500° C., to a thickness between about 1500 to 2000 Angstroms. The result of these depositions are schematically shown in FIG. 1.

Figure 2:
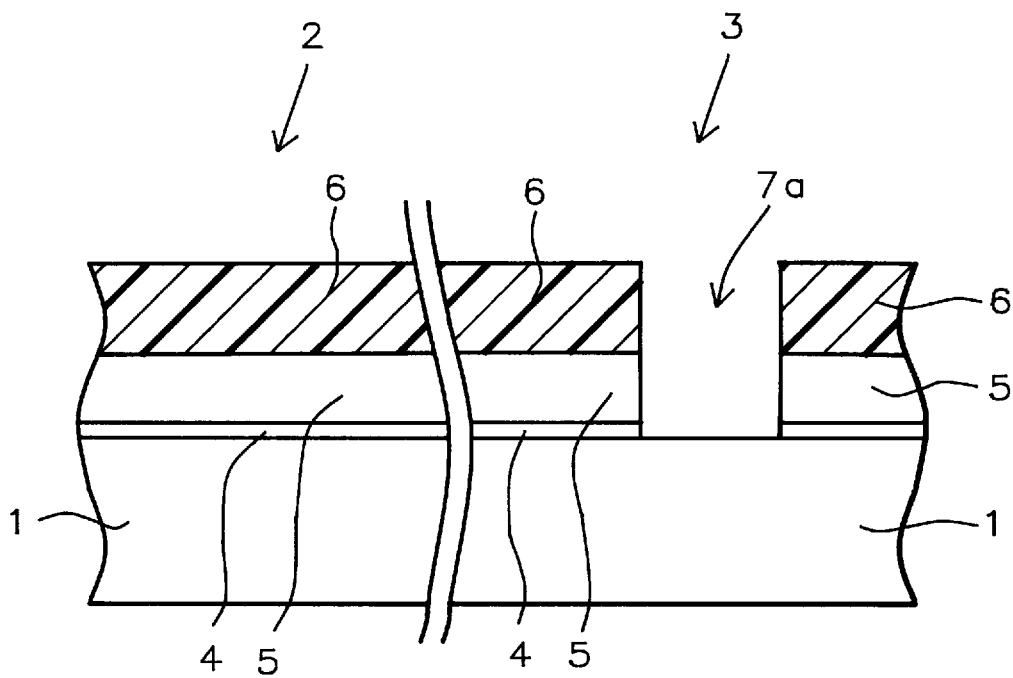
Figure 3:
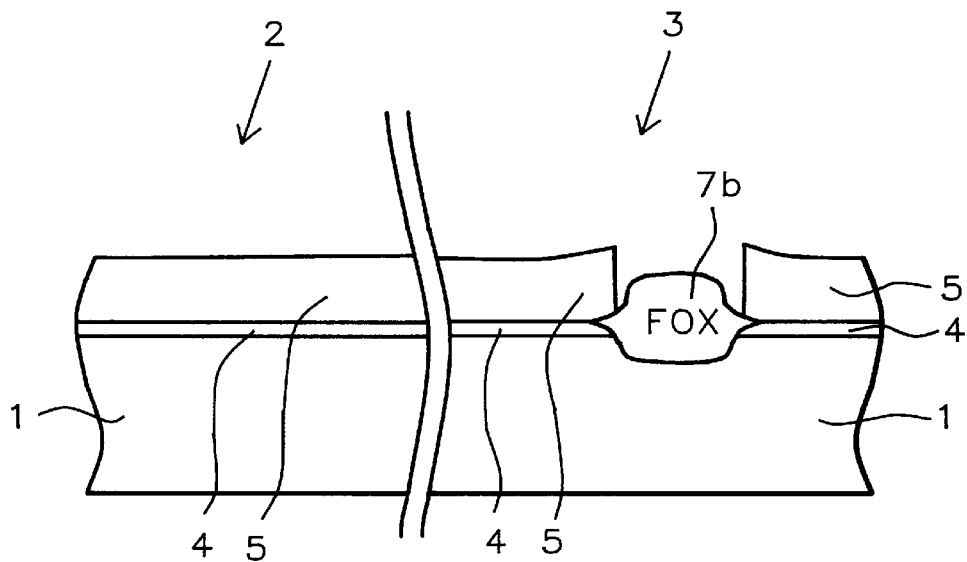

A photoresist shape 6, is next used to allow opening 7a, to be formed in silicon nitride layer 5, and in pad oxide layer 4, in MOSFET memory region 3, via RIE procedures, using $CHF_3$ ???? as an etchant. This is shown schematically in FIG. 2. After removal of photoresist shape 6, via plasma oxygen ashing and careful wet cleans, a thick FOX region, 7b, is thermally grown, in an oxygen - steam ambient, at a temperature between about 800° to 1200° C., to a thickness between about 3000 to 5000 Angstroms. FOX region 7b, schematically shown in FIG. 3, will be used for isolation of MOSFET memory devices, in MOSFET memory region 3.

Figure 4:
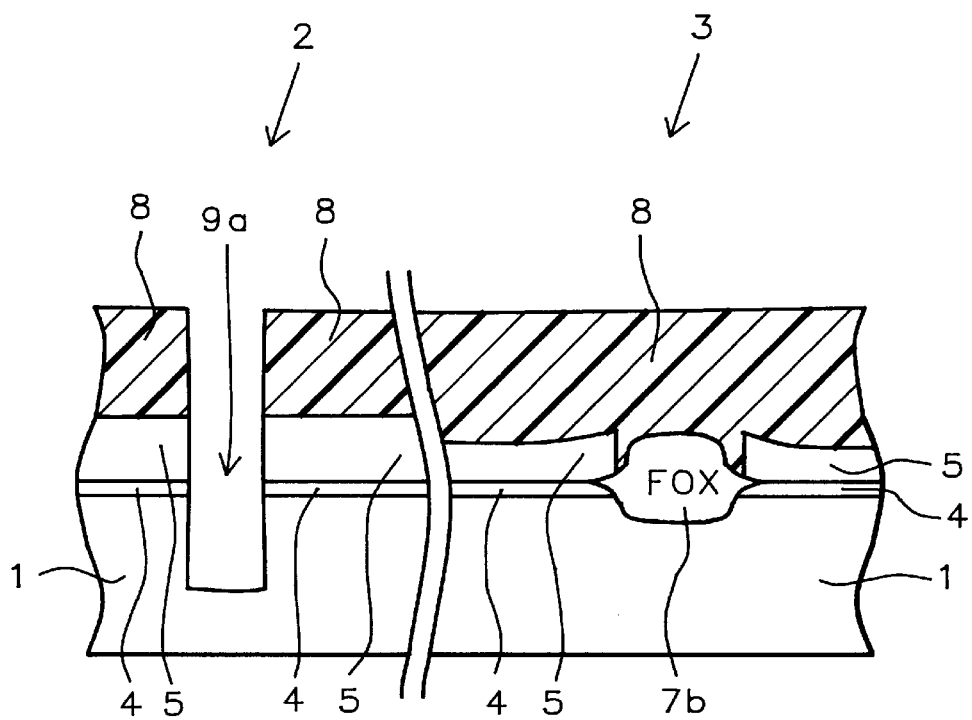

Another photoresist shape 8, is used to allow a narrow trench opening 9a, to be created in MOSFET logic region 2. Narrow trench opening 9a, with a diameter between about 0.10 to 1.0 uM, is formed via anisotropic RIE procedures, using $CHF_3$ as an etchant for silicon nitride layer 5, and for pad oxide layer 4, while $Cl_2$ is used as the etchant to create narrow trench opening 9a, in semiconductor substrate 1. The depth of the narrow trench opening 9a, in semiconductor substrate 1, is between about 3000 to 5000 Angstroms, and schematically shown in FIG. 4. Removal of photoresist shape 8, is accomplished using plasma oxygen ashing and careful wet cleans.

Figure 5:
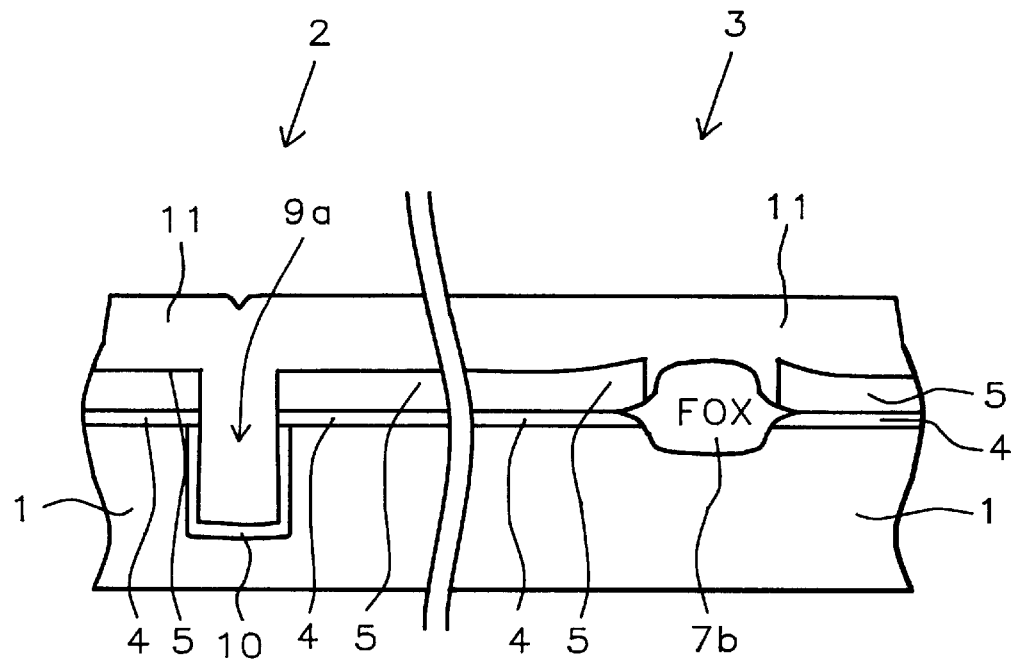

A thin layer of silicon oxide 10, is thermally grown, in an oxygen - steam ambient, at a temperature between about 850° to 1050° C., to a thickness between about 100 to 500 Angstroms, for purposes of passivating narrow trench opening 9a, with a dense, thermal oxide layer. A deposition of an insulator layer 11, is next performed, using sub-atmospheric chemical vapor deposition, (SACVD), procedures, at a temperature between about 300° to 500° C., using ozone and tetraethylorthosilicate, (TEOS), and deposited to a thickness between about 3000 to 5000 Angstroms. Insulator layer 11, completely fills narrow trench opening 9a, in addition to overlying silicon nitride layer 5, and thick FOX region 7b. This is schematically shown in FIG. 5.

Figure 6:
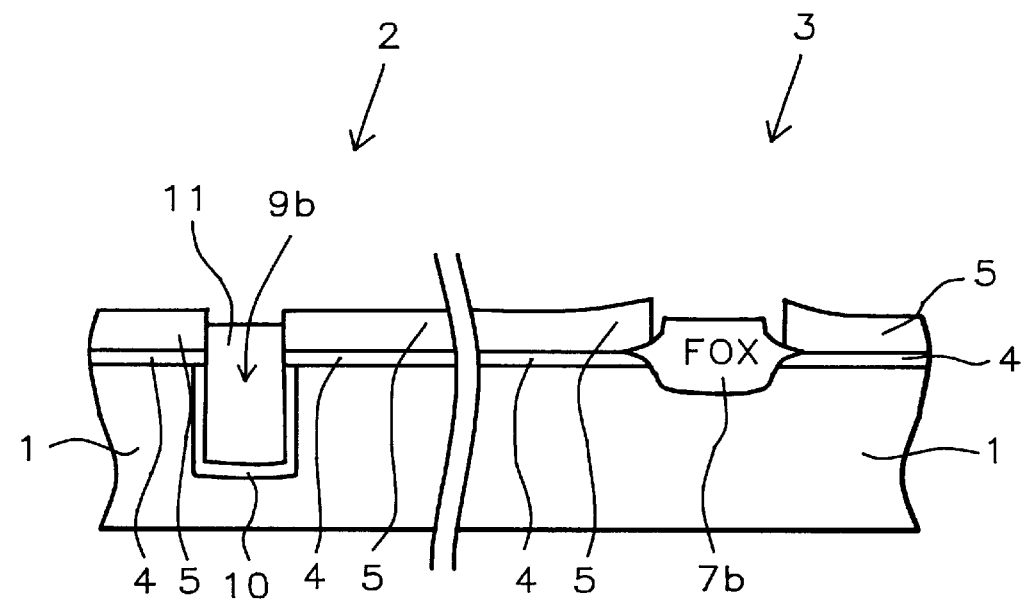

A CMP procedure is next employed to selectively remove insulator layer 11, from the top surface of silicon nitride layer 5. The CMP procedure selectively removes silicon oxide while not attacking silicon nitride films. Thus an extended CMP procedure, used to insure complete removal of insulator layer 11, does result in removal of a top portion of thick FOX region 7b, resulting in a flatter, truncated, thick FOX region 7b. This flattened FOX shape, allows easier coverage of overlying conductive layers, compared to counterparts in which overlying conductive layers have to contour the steeper, unpolished, FOX topography. In addition the selective CMP procedure, results in some removal of insulator layer 11, in narrow trench opening 11, below the top surface of silicon nitride layer 5. The result of the CMP procedure is schematically shown in FIG. 6.

Figure 7:
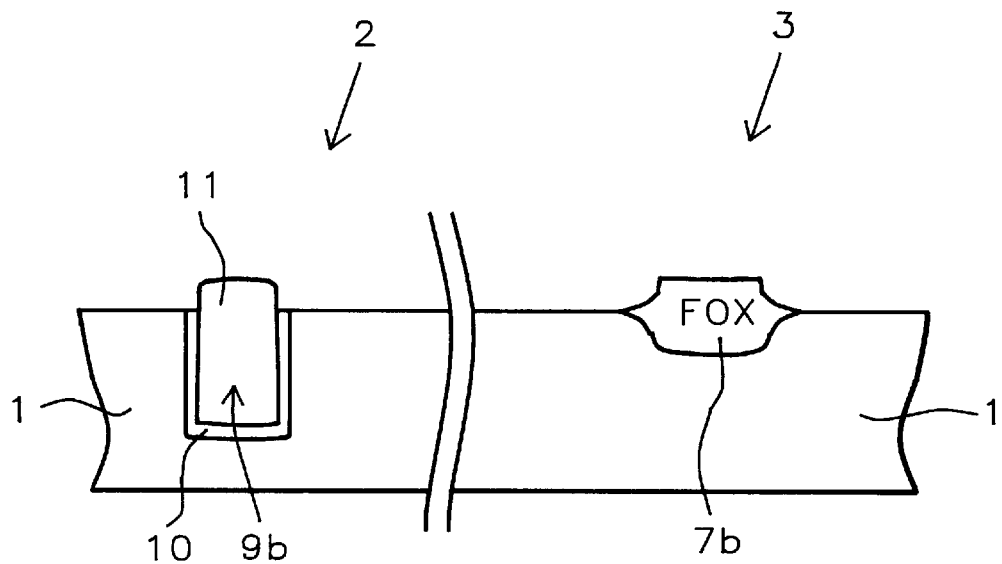

FIG. 7, schematically shows the result of removing both silicon nitride layer 5, as well as pad oxide layer 4. Silicon nitride layer 5, is removed using hot phosphoric acid, at a temperature between about 65° to 150° C., while pad oxide layer 4, is removed using a buffered hydrofluoric acid solution. The result of removing these layers is an insulator filled, narrow trench 9b, in the MOSFET logic region 2, with insulator layer 11, level to, or slightly raised, from the top surface of semiconductor substrate 1, and a flattened FOX region 7b, in MOSFET memory region 3.

Figure 8:
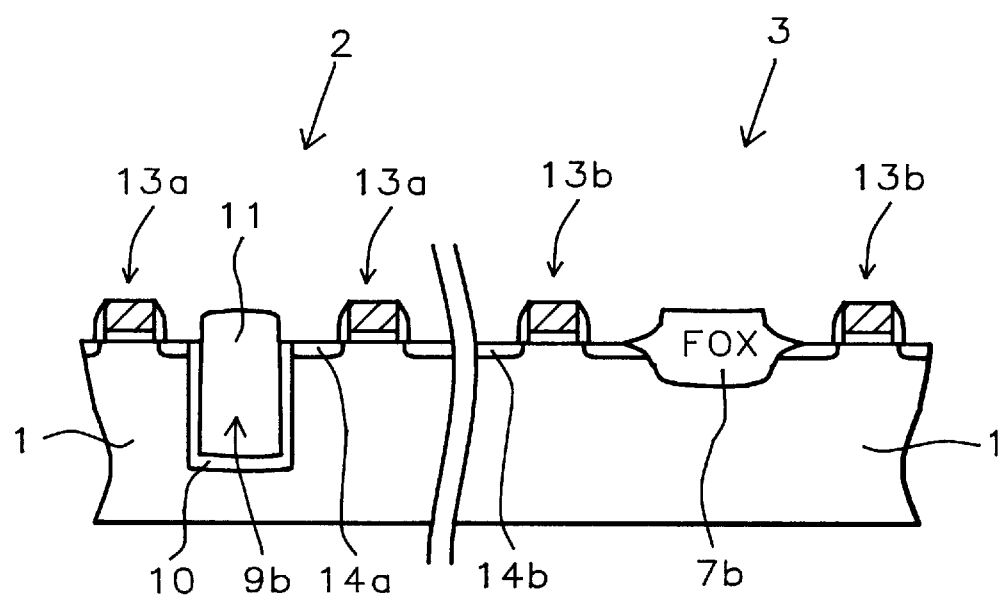
FIG. 8, which schematically, in cross-sectional style, shows the formation of the MOSFET devices, and the respective isolation regions.

FIG. 8, schematically shows the result of placing polysilicon gate structure 13a, and source and drain region 14a, in MOSFET logic region 2, while placing polysilicon gate structure 13b, and source and drain region 14b, in MOSFET memory region 3. Polysilicon gate structure 13a, including an underlying gate oxide layer and insulator sidewall spacer, and source and drain region 14a, are constructed to supply the performance characteristics needed for MOSFET logic region 2, while counterpart polysilicon gate structure 13b, including an underlying gate oxide layer and insulator sidewall spacer, and source and drain region 14b, are fabricated with consideration to the desired memory aspects, needed in MOSFET memory region 3.

While this invention has been particularly shown and described with reference to the preferred embodiments thereof, it will be understood by those skilled in the art that various changes in form and details may be made without departing from the spirit and scope of the invention.

What is claimed is:

1. A method for forming a thick FOX isolation region, in an area of a semiconductor substrate to be used for a MOSFET memory region, while forming an insulator filled, trench isolation region, in an area of said semiconductor substrate to be used for a MOSFET logic region, comprising the steps of:

forming a pad oxide layer on said semiconductor substrate;

depositing a silicon nitride layer on said pad oxide layer;

forming an opening in said silicon nitride layer, and in said pad oxide layer, exposing said semiconductor substrate, only in an area of said semiconductor substrate used for said MOSFET memory region;

thermally growing a thick FOX isolation region in said semiconductor substrate, exposed in said opening in said silicon nitride layer and in said pad oxide layer;

forming a trench opening having exposed surfaces in said silicon nitride layer, in said pad oxide layer, and in said semiconductor substrate, only in an area of said semiconductor substrate used for said MOSFET logic region;

growing a thin silicon oxide layer on the exposed surfaces of said trench opening;

depositing an insulator layer on the top surface of said silicon nitride layer, on the top surface of said thick FOX isolation regions, and completely filling said trench opening;

removing said insulator layer from said top surface of said silicon nitride layer, and from said top surface of said thick FOX isolation region, and leaving said insulator layer in said trench opening, forming said insulator filled, trench isolation region, in an area of said semiconductor substrate, used for said MOSFET logic region;

removing said silicon nitride layer, and said pad oxide layer; and forming polysilicon gate structures, and source and drain regions, in said MOSFET memory region, and in said MOSFET logic region.

2. The method of claim 1, wherein said silicon nitride layer is obtained via LPCVD or PECVD procedures at a temperature between about 300° to 500° C., to a thickness between about 1500 to 2000 Angstroms.

3. The method of claim 1, wherein said thick FOX isolation region is formed via thermal oxidation of said semiconductor substrate, in an oxygen - steam ambient, at a temperature between about 800° to 1200° C., to a thickness between about 3000 to 5000 Angstroms.

4. The method of claim 1, wherein said trench opening is formed via anisotropic RIE procedures, using $CHF_3$ as an etchant for said silicon nitride layer, and for said pad oxide layer, while $Cl_2$ is used as an etchant to form said trench opening in said semiconductor substrate.

5. The method of claim 1, wherein said trench opening has a diameter between about 0.10 to 1.0 uM, and a depth, in said semiconductor substrate, between about 3000 to 5000 Angstroms.

6. The method of claim 1, wherein said insulator layer, used to fill said trench opening, is silicon oxide, deposited using SACVD procedures, at a temperature between about 300° to 500° C., to a thickness between about 3000 to 5000 Angstroms, using ozone and TEOS as a source.

7. The method of claim 1, wherein said insulator layer is selectively removed from the top surface of said silicon nitride layer, and from the top surface of said thick FOX isolation regions, using CMP procedures.

8. The method of claim 1, wherein said silicon nitride layer is removed using a hot phosphoric acid solution, at a temperature between about 65° to 150° C.

* * * * *